United States Patent
Cheek et al.

[11] Patent Number: 6,162,694
[45] Date of Patent: Dec. 19, 2000

[54] METHOD OF FORMING A METAL GATE ELECTRODE USING REPLACED POLYSILICON STRUCTURE

[75] Inventors: Jon Cheek, Round Rock; Derick Wristers, Austin; Mark I Gardner, Cedar Creek, all of Tex.

[73] Assignee: Advanced Micro Devices, Inc., Sunnyvale, Calif.

[21] Appl. No.: 09/199,674

[22] Filed: Nov. 25, 1998

[51] Int. Cl.⁷ .................................................. H01L 21/336
[52] U.S. Cl. .......................... 438/305; 438/300; 438/301
[58] Field of Search .................................... 438/305, 306, 438/307, 663, 300, 301, 302, 303, 304

[56] References Cited

U.S. PATENT DOCUMENTS

| | | | |
|---|---|---|---|
| 4,505,028 | 3/1985 | Kobayashi | 438/301 |
| 5,006,480 | 4/1991 | Chang et al. | 438/251 |
| 5,168,072 | 12/1992 | Moslehi | 438/300 |
| 5,491,099 | 2/1996 | Hsu | 438/302 |
| 5,780,350 | 7/1998 | Kapoor | 438/305 |
| 5,789,802 | 8/1998 | Tripsas | 257/607 |
| 5,856,225 | 1/1999 | Lee et al. | 438/291 |
| 5,994,179 | 11/1999 | Masuoka | 438/227 |

OTHER PUBLICATIONS

Stanley Wolf Ph.D. and Richard N. Tauber Ph.D. in Silicon Processing for the VLSI Era, vol. 1: Process Technology, Lattice Press, pp. 57 and 384, Jan. 1986.

Wolf V. I as applied to claim 1 above, and further in view of Stanley Ph.D. in Silicon Processing for the VSLI Era, vol. 2: Process Integration, Lattice Press, pp. 238 and 239, Jan. 1990.

*Primary Examiner*—Charles Bowers
*Assistant Examiner*—William M. Brewster

[57] ABSTRACT

A metal gate electrode formed with high temperature activation of source/drain and LDD implants and a process for manufacture. A polysilicon alignment structure is formed on a silicon substrate. Source/drain regions are formed in alignment with the polysilicon alignment structure, and the alignment structure and the substrate are subjected to a first rapid thermal anneal. LDD implant regions are formed and the alignment structure and the substrate having the LDD regions are subjected to a second rapid thermal anneal. The polysilicon alignment structure is replaced with a metal gate electrode and gate dielectric.

20 Claims, 2 Drawing Sheets

METHOD OF FORMING A METAL GATE ELECTRODE USING REPLACED POLYSILICON STRUCTURE

FIELD OF THE INVENTION

The present invention is directed generally to semiconductor structures and, more particularly, to structures having metal gate electrodes formed with high temperature activation of source/drain and LDD implants.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel region.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region/drain regions. In this manner an electric field controls the current flow through the channel region. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

Several objectives influence MOSFET design and fabrication. First, there is a desire to reduce the dimensions of the MOSFET. Increasing the number of individual MOSFETs that can be placed onto a single silicon chip or die produces increased functionality per chip. Second, there is a continual desire to improve performance, and particularly the speed, of the MOSFET transistors. This pursuit is manifested in shorter conduction channel lengths and in efforts to obtain low contact resistivity at the MOSFET junctions. These aspects offer increased MOSFET speed and allow for a greater number of operations to be performed by the MOSFET in less time. MOSFETs are used in great quantity in computers where the push to obtain higher operation cycle speeds demands faster MOSFET performance. Lastly, there exists a constant need to minimize costly MOSFET fabrication steps.

Many prior MOSFETs designs have metal gate electrodes. However, with the challenges that accompany submicron gate alignment and modern high-temperature processing, metal gate electrodes have often been replaced with polysilicon gate electrodes. One difficulty faced in making semiconductor structures having metal gates is that the melting point of the metal is below the temperatures applied to the structure during thermal annealing to activate various dopant regions. Polysilicon, in contrast, has a much higher melting point. Thus, polysilicon is often used for gate electrodes. However, metal is desirable because of its conductivity and its ability to produce a stronger electric field.

Conventional approaches have encountered difficulty trying to maintain performance in the face of decreasing size and increasing density of devices. In attempting to overcome these hurdles, it is equally desirable to keep costly processing steps to a minimum. Therefore, it is desirable to provide a semiconductor structure and provide a process for its manufacture to address the above identified problems.

SUMMARY OF THE INVENTION

Generally, the present invention relates to a semiconductor structure and a process for its manufacture. In one embodiment, a process is provided for manufacturing a semiconductor structure. The process comprises forming a substrate and forming a polysilicon alignment structure on the substrate. Source and drain regions are formed in the substrate and aligned with the alignment structure, and the alignment structure and the substrate having the source and drain regions are subjected to a first rapid thermal anneal. LDD regions are formed in the substrate and aligned with the alignment structure, and the alignment structure and the substrate having the lightly doped drain regions are subjected to a second rapid thermal anneal. The polysilicon alignment structure is replaced with a metal gate electrode and gate dielectric.

In another embodiment, a semiconductor structure is provided. The semiconductor structure comprises an oxide layer disposed on a substrate with a trench formed in the oxide layer. A gate dielectric layer is disposed on the substrate at the base of the trench, and a metal gate electrode disposed on the gate dielectric layer in the trench. Source and drain regions are disposed in the substrate adjacent the gate dielectric layer, and lightly-doped drain regions are disposed in the substrate adjacent the gate dielectric layer and at least partially directly below the gate dielectric layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
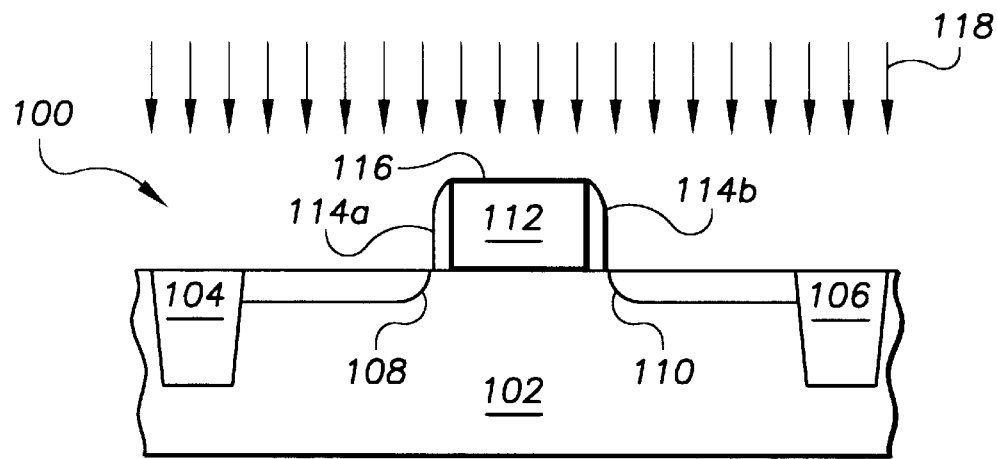
FIG. 1 is a partial cross-sectional view of an example semiconductor structure including a substrate upon which isolation trenches and source/drain regions have been formed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications where metal gate electrodes are desirable, such as in PMOS, NMOS, CMOS, and BiCMOS devices. While the present invention is not so limited, an appreciation of various aspects of the invention is best gained through a discussion of various application examples of processes used to form such semiconductor devices.

The invention has as one example aspect, the formation of a metal gate electrode in a semiconductor structure. One difficulty faced in making semiconductor structures having metal gates is that the melting point of the metal is below the temperatures applied to the structure during thermal annealing to activate various dopant regions. Polysilicon, in contrast, has a much higher melting point. Thus, polysilicon is often used for gate electrodes. Metal is desirable because of its conductivity and its ability to produce a stronger electric field.

FIGS. 1–4 illustrate semiconductor structures at various stages in a process flow in accordance with example embodiments of the invention. FIG. 1 is a partial cross-sectional view of an example semiconductor structure 100 including a substrate 102 upon which isolation trenches 104 and 106 and source/drain regions 108 and 110 have been formed. In an example CMOS embodiment, the substrate 102 is a p+ silicon bulk which incorporates p-well and n-well regions. The well formation process is suitably accomplished by implanting selected impurity distributions into the appropriate well regions in conjunction with conventional masking steps. For example, for p-well regions ions of boron are implanted, and for n-well regions ions of phosphorous are implanted. The structure 100 also includes a polysilicon region 112 and spacers 114a and 114b. The polysilicon region 112 and spacers 114a–b are used in aligning the source/drain regions 108 and 110, subsequently formed lightly-doped drain (LDD) regions, and in creating a trench for a subsequently deposited metal gate electrode. Polysilicon is used in the formation of the source/drain regions 108 and 110 because it is not susceptible to damage from high temperatures during rapid thermal annealing (RTA). The structure 100 is formed in accordance with the following example process sequence.

A photo-resist mask pattern (not shown) is formed on the substrate 102 to pattern the trenches 104 and 106. The trenches 104 and 106 are then formed by etching the silicon substrate 102 to a desired depth using a plasma anisotropic etch process in which the plasma contains fluorine or chlorine. The photo-resist material is then stripped, and the resulting trenches 104 and 106 are filled in accordance with conventional processes. It will be appreciated that both shallow trench isolation LOCOS isolation are compatible with the present invention.

After the trenches 104 and 106 are formed and filled, a layer (not shown) of polysilicon is deposited on the substrate 102. The deposition is accomplished by blanket depositing polysilicon in a chemical vapor deposition process. Because the polysilicon is used only for alignment of a metal gate to be subsequently deposited, doping the polysilicon is unnecessary. A photo-resist mask pattern (not shown) is formed over the polysilicon layer to pattern the polysilicon region 112. The polysilicon is then etched, leaving region 112, and the photo-resist material is stripped.

The spacers 114a-b are nitride and are formed following the LDD implant. In a first stage, spacer material is deposited over the entire semiconductor structure. The spacer material is then removed using, for example, an anisotropic etch, leaving spacers 114a–b.

A first concentration of a first dopant species is introduced, as represented by arrows 118 to form the source and drain regions 108 and 110, which are aligned with the spacers 114a–b. The first dopant species may be ions of boron, phosphorus, or arsenic, for example, implanted at an energy level that ranges from approximately 5 keV to 60 keV and an ion concentration of approximately 2E15–6 E15 ions/cm$^2$. A high temperature rapid thermal anneal (RTA) process is then performed on the structure 100 to activate the source/drain regions 108 and 110. For example, the high-temperature RTA may involve temperatures in the range of approximately 950°–1060° C. applied for a period of approximately 6 to 30 seconds. It will be appreciated that the polysilicon region 112 is not adversely affected by the temperatures of the RTA, whereas if metal were present, it would melt or evaporate.

Figure 2:
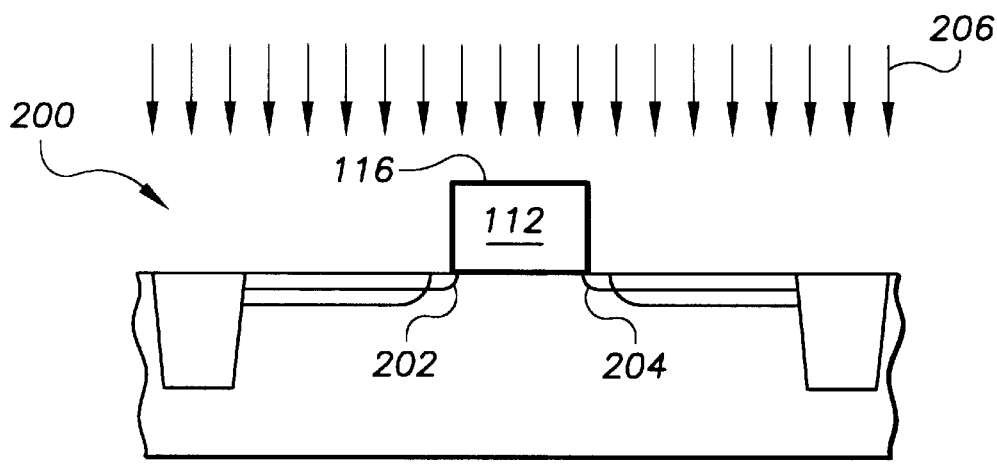
FIG. 2 is a partial cross-sectional view of a semiconductor structure having LDD regions formed therein.

FIG. 2 is a partial cross-sectional view of a semiconductor structure 200 having LDD regions 202 and 204 formed therein. Prior to the LDD implant, the spacers 114a–b are removed using an oxide etch.

The LDD implant is represented as arrows 206. In an example embodiment, the ion concentration of the LDD implant is in the range of approximately 8E14 to 3E15 ions/cm$^2$, and the implant energy can range from approximately 0.5 keV to 5 keV. The LDD implant may be ions of boron, phosphorus, or arsenic, for example.

Following the LDD implant, the structure 200 is subjected to an RTA to activate the LDD regions 202 and 204. The RTA may involve, for example, temperatures in the range of approximately 950°–1060° C. applied for a period of approximately 6 to 30 seconds.

Figure 3:
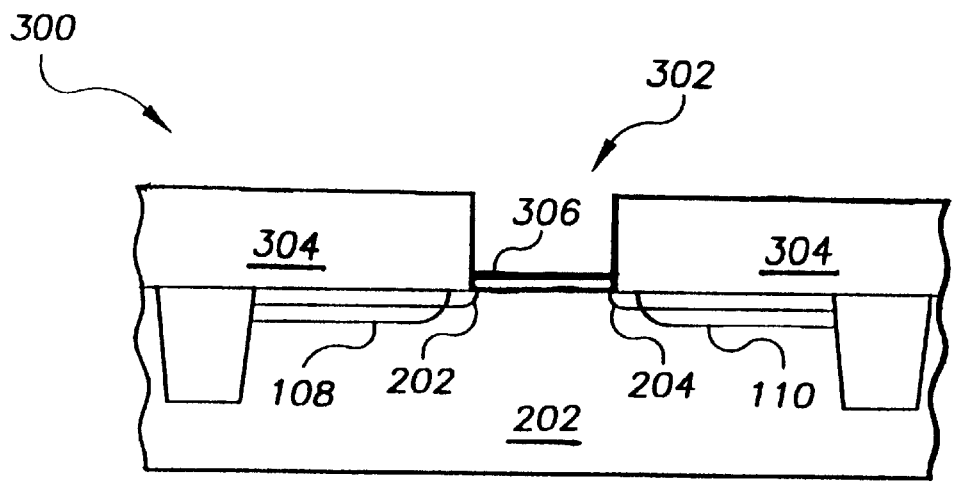
FIG. 3 is partial cross-sectional view of a semiconductor structure in which a gate trench is formed after having deposited a layer of oxide and removed the polysilicon region.

FIG. 3 is a partial cross-sectional view of a semiconductor structure 300 in which a gate trench 302 is formed after having deposited a layer 304 of oxide and removed the polysilicon region 112 of FIG. 2. Following the process sequence described in conjunction with FIG. 2, a layer of oxide is deposited on the substrate 202 and over the polysilicon region 112 (FIG. 2), and the oxide layer is planarized with the upper surface 116 (FIG. 1) of the polysilicon region. The polysilicon region 112 is etched, for example, using a plasma anisotropic etch or a wet etch that is highly selective to polysilicon. Removal of the polysilicon leaves trench 302 which is aligned with the source/drain regions 108 and 110 and with the LDD regions 202 and 204.

A gate oxide 306 is grown at the base of the trench 302 to an implementation selected depth. The gate oxide 306 forms the gate dielectric.

Figure 4:
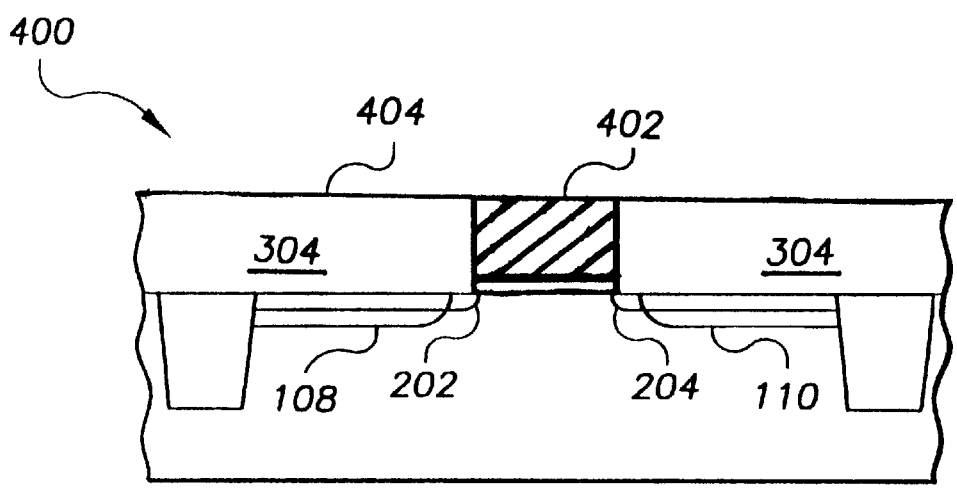
FIG. 4 is a partial cross-sectional view of a semiconductor structure in which the gate trench has been filled with a selected metal to form metal gate electrode.

FIG. 4 is a partial cross-sectional view of a semiconductor structure 400 in which the gate trench 302 (FIG. 3) has been filled with a selected metal to form metal gate electrode 402. The metal gate electrode 402 is formed by depositing metal over the oxide layer 304 and planarizing the metal with the surface 404 of the oxide layer. Thus, the polysilicon region 112 (FIGS. 1 and 2) provided for formation of source/drain regions 108 and 110 and LDD regions 202 and 204 that are self-aligned with the metal gate electrode 402. It will be appreciated that a metal gate electrode is formed from a metal-filled trench with planarized oxide on both sides. No spacers are required in the final structure.

Fabrication then continues to form a final structure. For example, the oxide layer 304 is masked and etched to form source and drain contact regions, and thereafter, metal is deposited in the source and drain contacts.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process for making a semiconductor structure with a silicon substrate, comprising:

forming a polysilicon alignment structure on the substrate;

implanting at a first energy level a first concentration of a first dopant species into the substrate, whereby source and drain regions are formed in the substrate and aligned with the alignment structure;

subjecting the alignment structure and the substrate having the source and drain regions to a first rapid thermal anneal;

implanting at a second energy level a second concentration of a second dopant species into the substrate, and thereby forming lightly doped regions in the substrate and aligned with the alignment structure;

subjecting the alignment structure and the substrate having the lightly doped regions to a second rapid thermal anneal; and replacing the polysilicon alignment structure with a metal gate electrode and gate dielectric.

2. The process of claim 1, further comprising:

forming spacers adjacent to the alignment structure, whereby the source/drain regions are aligned with the spacers; and removing the spacers prior to forming the lightly-doped regions.

3. The process of claim 1, further comprising:

depositing a layer of oxide over the substrate and alignment structure;

planarizing the oxide layer with the alignment structure; and etching the polysilicon alignment structure, whereby a trench is formed in the oxide layer.

4. The process of claim 3, further comprising growing a gate oxide in the trench.

5. The process of claim 1, wherein the first rapid thermal anneal is sustained at a temperature in the range of approximately 950° to 1060° C. for approximately 6 to 30 seconds.

6. The process of claim 5, wherein the second rapid thermal anneal is sustained at a temperature in the range of approximately 950° to 1060° C. for approximately 6 to 30 seconds.

7. The process of claim 1, wherein the second rapid thermal anneal is sustained at a temperature in the range of approximately 950° to 1060° C. for approximately 6 to 30 seconds.

8. The process of claim 1, wherein the metal is selected from the group of titanium, tungsten, and aluminum.

9. The process of claim 1, further comprising:

forming spacers adjacent to the alignment structure, whereby the source/drain regions are aligned with the spacers;

removing the spacers prior to forming the lightly-doped regions;

depositing a layer of oxide over the substrate and alignment structure;

planarizing the oxide layer with the alignment structure;

etching the polysilicon alignment structure, whereby a trench is formed in the oxide layer;and growing a gate oxide in the trench.

10. The process of claim 9, wherein the first rapid thermal anneal is sustained at a temperature in the range of approximately 950° to 1060° C. for approximately 6 to 30 seconds.

11. The process of claim 10, wherein the second rapid thermal anneal is sustained at a temperature in the range of approximately 950° to 1060° C. for approximately 6 to 30 seconds.

12. The process of claim 9, wherein the second rapid thermal anneal is sustained at a temperature in the range of approximately 950° to 1060° C. for approximately 6 to 30 seconds.

13. The process of claim 9, wherein the metal is selected from the group of titanium, tungsten, and aluminum.

14. The process of claim 9, wherein the first dopant species are ions selected from the group of boron, phosphorus, or arsenic and implanted at an energy level of approximately 5 keV to 60 keV with a dose rate of approximately 2E15–6E15 ions/cm$^2$.

15. The process of claim 10, wherein the second dopant species are ions selected from the group of boron, phosphorus, or arsenic and implanted at an energy level of approximately 0.5 keV to 5 keV with a dose rate of approximately 8E14 to 3E15 ions/cm$^2$.

16. A process for making a semiconductor structure with a silicon substrate, comprising:

forming a polysilicon alignment structure on the substrate;

implanting at a first energy level a first concentration of a first dopant species into the substrate, and thereby forming source and drain regions in the substrate and aligned with the alignment structure;

subjecting the alignment structure and the substrate having the source and drain regions to a first rapid thermal anneal;

implanting at a second energy level a second concentration of a second dopant species into the substrate, thereby forming lightly doped regions in the substrate and aligned with the alignment structure;

subjecting the alignment structure and the substrate having the lightly doped regions to a second rapid thermal anneal;

depositing an oxide layer over the substrate and the alignment structure;

planarizing the oxide layer with the alignment structure;

etching the polysilicon alignment structure, whereby a trench is formed in the oxide layer and the substrate is exposed;

growing a gate oxide in the trench with a selected depth; and depositing a metal over the oxide layer and planarizing the metal with the surface of the oxide layer.

17. The method according to claim 16, wherein the dopant species are ions selected from the group of boron, phosphorus and arsenic.

18. The method according to claim 16, wherein the metal is selected from the group of titanium, tungsten and aluminum.

19. A process for making a semiconductor structure with a silicon substrate, comprising the sequential steps of:

forming a polysilicon alignment structure on the substrate;

forming spacer adjacent to the alignment structure;

implanting at a first energy level a first concentration of a first dopant species into the substrate, and thereby forming source and drain regions in the substrate and aligned with the spacers;

subjecting the alignment structure and the substrate having the source and drain regions to a first rapid thermal anneal;

removing the spacers;

implanting at a second energy level a second concentration of a second dopant species into the substrate, whereby lightly doped regions are formed in the substrate and aligned with the alignment structure;

subjecting the alignment structure and the substrate having the lightly doped regions to a second rapid thermal anneal;

forming an oxide layer over the substrate planar to the alignment structure;

etching the polysilicon alignment structure, whereby a trench is formed in the oxide layer;

forming a gate electrode structure in the trench, including an oxide layer and a gate formed thereon.

20. The process according to claim 19, wherein the dopant species are ions selected from the group of boron, phosphorus and arsenic.

* * * * *

UNITED STATES PATENT AND TRADEMARK OFFICE
CERTIFICATE OF CORRECTION

PATENT NO.    : 6,162,694
DATED         : December 19, 2000
INVENTOR(S)   : Cheek et al.

It is certified that error appears in the above-identified patent and that said Letters Patent is hereby corrected as shown below:

Column 3,
Line 1, "is partial" should read -- is a partial --.

Column 4,
Line 4, "isolation LOCOS" should read -- isolation and LOCOS --.

Signed and Sealed this

Eleventh Day of February, 2003

JAMES E. ROGAN
*Director of the United States Patent and Trademark Office*